(12) United States Patent
Chang et al.

(10) Patent No.: US 9,224,773 B2
(45) Date of Patent: Dec. 29, 2015

(54) METAL SHIELDING LAYER IN BACKSIDE ILLUMINATION IMAGE SENSOR CHIPS AND METHODS FOR FORMING THE SAME

(75) Inventors: Shih-Chieh Chang, Taipei (TW);
Jian-Shin Tsai, Tainan (TW);
Chih-Chang Huang, Chiayi (TW);
Ing-Ju Lee, Tainan (TW); Ching-Yao Sun, Kaohsiung (TW); Jyun-Ru Wu, Tainan (TW); Ching-Che Huang, New Taipei (TW); Szu-An Wu, Tainan (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 397 days.

(21) Appl. No.: 13/420,279

(22) Filed: Mar. 14, 2012

(65) Prior Publication Data

US 2013/0134541 A1 May 30, 2013

Related U.S. Application Data

(60) Provisional application No. 61/565,191, filed on Nov. 30, 2011.

(51) Int. Cl.
*H01L 27/146* (2006.01)

(52) U.S. Cl.
CPC ...... *H01L 27/14623* (2013.01); *H01L 27/1464* (2013.01); *H01L 27/14636* (2013.01); *H01L 27/1462* (2013.01); *H01L 27/14643* (2013.01); *H01L 27/14683* (2013.01)

(58) Field of Classification Search
CPC ............... H01L 27/1464; H01L 27/14623
See application file for complete search history.

(56) References Cited

U.S. PATENT DOCUMENTS

| | | | | | |
|---|---|---|---|---|---|
| 6,162,586 | A | * | 12/2000 | Sengupta et al. | 430/314 |
| 6,504,228 | B1 | * | 1/2003 | Sone | 257/532 |
| 6,522,013 | B1 | * | 2/2003 | Chen et al. | 257/774 |
| 6,890,852 | B2 | | 5/2005 | Matsubara | |
| 7,935,994 | B2 | | 5/2011 | Wang et al. | |

(Continued)

FOREIGN PATENT DOCUMENTS

| | | |
|---|---|---|
| JP | 09074075 | 3/1997 |
| JP | 11307530 A | 11/1999 |

(Continued)

OTHER PUBLICATIONS

"Categories of Solids," Purdue University, Chemical Education Division Groups Website, http://chemed.chem.purdue.edu/genchem/topicreview/bp/ch13/category.php.*

Primary Examiner — Tucker Wright
(74) Attorney, Agent, or Firm — Slater & Matsil, L.L.P.

(57) ABSTRACT

A device includes a semiconductor substrate having a front side and a backside. A photo-sensitive device is disposed at a surface of the semiconductor substrate, wherein the photo-sensitive device is configured to receive a light signal from the backside of the semiconductor substrate, and convert the light signal to an electrical signal. An amorphous-like adhesion layer is disposed on the backside of the semiconductor substrate. The amorphous-like adhesion layer includes a compound of nitrogen and a metal. A metal shielding layer is disposed on the backside of the semiconductor substrate and contacting the amorphous-like adhesion layer.

20 Claims, 7 Drawing Sheets

(56) References Cited

U.S. PATENT DOCUMENTS

| | | | |
|---|---|---|---|
| 8,101,978 B2 | 1/2012 | Dai et al. | |
| 8,299,554 B2 | 10/2012 | Adkisson et al. | |
| 2001/0005621 A1* | 6/2001 | Lai et al. | 438/586 |
| 2001/0009292 A1* | 7/2001 | Nishinohara et al. | 257/402 |
| 2001/0019301 A1* | 9/2001 | Shibuya et al. | 338/308 |
| 2002/0175420 A1* | 11/2002 | Dorleans | 257/774 |
| 2005/0054191 A1* | 3/2005 | Yu et al. | 438/629 |
| 2006/0128128 A1* | 6/2006 | Hintze et al. | 438/584 |
| 2008/0150057 A1* | 6/2008 | Lee et al. | 257/432 |
| 2008/0254617 A1* | 10/2008 | Adetutu et al. | 438/643 |
| 2009/0020838 A1* | 1/2009 | Lin et al. | 257/432 |
| 2009/0189235 A1* | 7/2009 | Ikeda et al. | 257/432 |
| 2009/0201393 A1 | 8/2009 | Tai et al. | |
| 2009/0206434 A1* | 8/2009 | Hashimoto | 257/432 |
| 2009/0261937 A1 | 10/2009 | Ko et al. | |
| 2010/0110271 A1* | 5/2010 | Yanagita et al. | 348/340 |
| 2010/0127235 A1* | 5/2010 | Tsukamoto et al. | 257/5 |
| 2010/0207226 A1* | 8/2010 | Park et al. | 257/432 |
| 2010/0288995 A1* | 11/2010 | Ozawa et al. | 257/4 |
| 2011/0084196 A1 | 4/2011 | Kumano | |
| 2011/0102657 A1 | 5/2011 | Takahashi et al. | |
| 2011/0199518 A1 | 8/2011 | Zheng et al. | |
| 2011/0260221 A1* | 10/2011 | Mao et al. | 257/291 |
| 2012/0001286 A1* | 1/2012 | Yoon | 257/432 |
| 2012/0034793 A1* | 2/2012 | Narushima et al. | 438/785 |
| 2012/0086094 A1* | 4/2012 | Watanabe | 257/432 |
| 2012/0147208 A1* | 6/2012 | Otsuka et al. | 348/222.1 |
| 2012/0280348 A1* | 11/2012 | Chou et al. | 257/435 |
| 2013/0119500 A1* | 5/2013 | Weng et al. | 257/435 |

FOREIGN PATENT DOCUMENTS

| | | |
|---|---|---|
| JP | 2004134427 A | 4/2004 |
| JP | 2006156716 | 6/2006 |
| JP | 2006237576 A | 9/2006 |
| JP | 2011054963 A | 3/2011 |
| JP | 2011159985 | 8/2011 |
| KR | 100791346 B1 | 1/2008 |
| KR | 20110040693 A | 4/2011 |
| TW | 200950076 | 12/2009 |
| TW | 201042753 | 12/2010 |

* cited by examiner

METAL SHIELDING LAYER IN BACKSIDE ILLUMINATION IMAGE SENSOR CHIPS AND METHODS FOR FORMING THE SAME

This application claims the benefit of provisionally filed U.S. Patent Application No. 61/565,191, filed Nov. 30, 2011, and entitled "Metal shielding layer in Backside Illumination Image Sensor Chips and Methods for Forming the Same;" which application is hereby incorporated herein by reference.

BACKGROUND

Backside Illumination (BSI) image sensor chips are replacing front-side illumination sensor chips for their higher efficiency in capturing photons. In the formation of the BSI image sensor chips, image sensors and logic circuits are formed on a silicon substrate of a wafer, followed by the formation of an interconnect structure on a front side of the silicon chip.

The image sensors in the BSI image sensor chips generate electrical signals in response to the stimulation of photons. The magnitudes of the electrical signals (such as the currents) depend on the intensity of the incident light received by the respective image sensors. The image sensors, however, suffer from non-optically generated signals, which include the leakage signals, thermally generated signals, dark currents, and the like. Accordingly, the electrical signals generated by the image sensors need to be calibrated, so that the undesirable signals are cancelled out from the output signals of the image sensors. To cancel the non-optically generated signals, black reference image sensors are formed, and are used to generate non-optically generated signals. The black reference image sensors, therefore, need to be blocked from receiving light signals.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A metal shielding structure in a Backside Illumination (BSI) image sensor chip and the method of forming the same are provided in accordance with various exemplary embodiments. The intermediate stages of forming the metal shielding structure are illustrated. The variations of the embodiments are discussed. Throughout the various views and illustrative embodiments, like reference numbers are used to designate like elements.

FIGS. 1 through 6 illustrate the cross-sectional views of intermediate stages in the manufacturing of a metal shielding structure in accordance with some exemplary embodiments.

Figure 1:
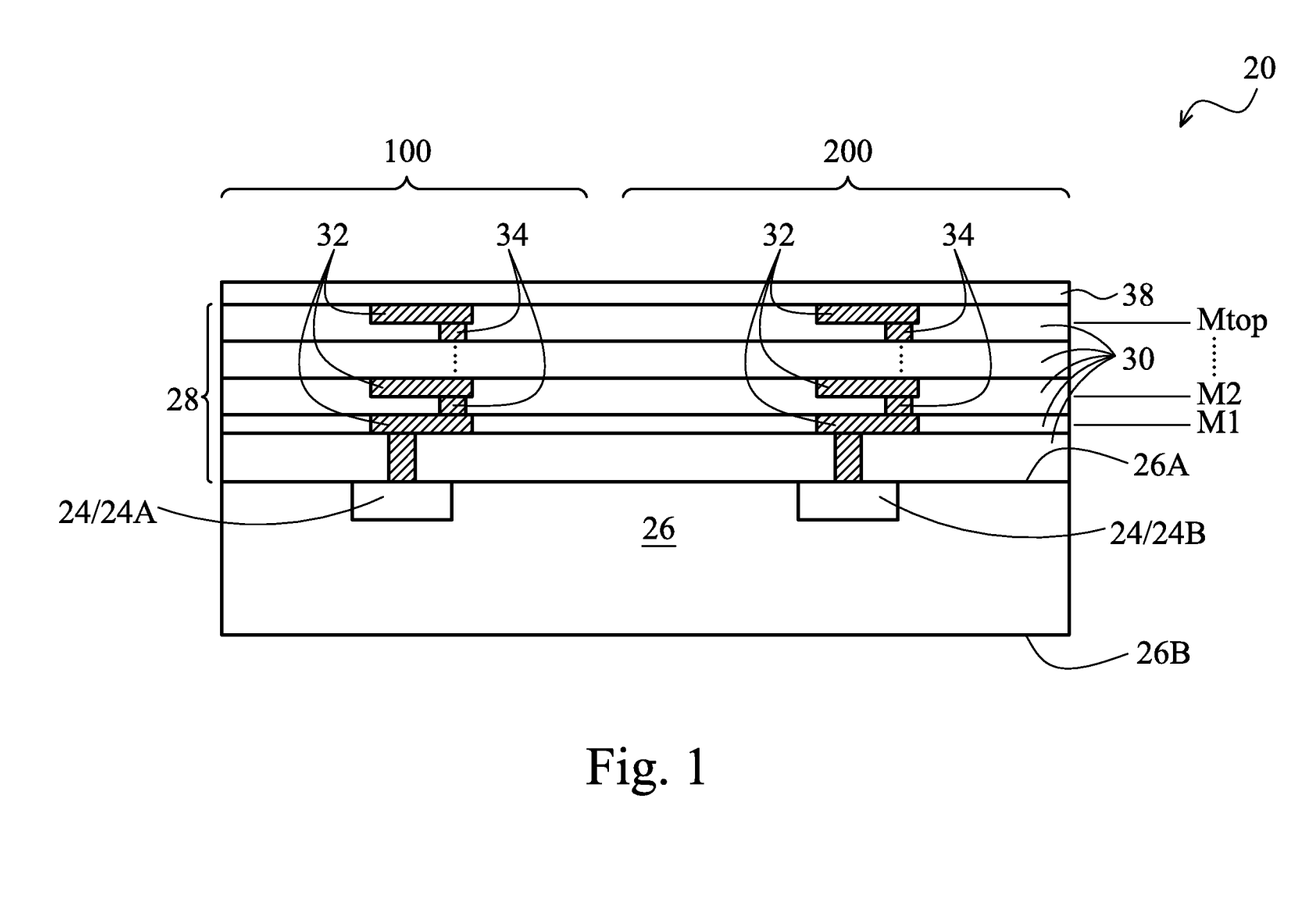
FIGS. 1 through 6 are cross-sectional views of intermediate stages in the manufacturing of a metal shielding structure in a Backside Illumination (BSI) image sensor chip in accordance with some exemplary embodiments.

FIG. 1 illustrates image sensor chip 20, which may be a part of an un-sawed wafer 22. Image sensor chip 20 includes semiconductor substrate 26. Semiconductor substrate 26 may be a crystalline silicon substrate or a semiconductor substrate formed of other semiconductor materials. Throughout the description, surface 26A is referred to a front surface of semiconductor substrate 26, and surface 26B is referred to as a back surface of semiconductor substrate 26. Image sensors 24 (including 24A and 24B) are formed at surface 26A of semiconductor substrate 26. Image sensors 24 are configured to convert light signals (photons) to electrical signals, and may be photo-sensitive MOS transistors or photo-sensitive diodes. Accordingly, the respective wafer 22 may be an image sensor wafer. In some exemplary embodiments, image sensors 24 extend from front surface 26A into semiconductor substrate 26. The structures of image sensors 24A and 24B may be identical to each other.

Front-side interconnect structure 28 is formed over semiconductor substrate 26, and is used to electrically interconnect the devices in image sensor chip 20. Front-side interconnect structure 28 includes dielectric layers 30, and metal lines 32 and vias 34 in dielectric layers 30. Throughout the description, the metal lines 32 in a same dielectric layer 30 are collectively referred to as being a metal layer. Front-side interconnect structure 28 includes metal layers includes M1, M2 . . . and Mtop, wherein metal layer M1 is the bottom metal layer of interconnect structure 28, and metal layer Mtop is the top metal layer of interconnect structure 28. In some exemplary embodiments, the lower layers in dielectric layers 30 are formed of low-k dielectric materials having low k values, for example, lower than about 3.0. The upper layer(s) in dielectric layer(s) 30 may be formed of low-k dielectric materials or non-low-k dielectric materials having k values greater than 3.9, or greater than about 4.5, for example. Passivation layer 38 is formed over top metal layer Mtop. Passivation layer 38 may be formed of a non-low-k dielectric material having a k value greater than 3.9. In some embodiments, passivation layer 38 includes a silicon oxide layer and a silicon nitride layer on the silicon oxide layer.

Image sensor chip 20 includes active image sensor pixel region 100 and black reference pixel region 200. Active image sensor pixel region 100 includes active image sensor 24A formed therein, which is used for generating electrical signals from the sensed light. Although one image sensor 24A is illustrated, there may be a plurality of image sensors 24A that form active image sensor pixel array 40 (not shown in FIG. 1, please refer to FIG. 7). The entirety of active image sensor pixel array 40 is located in active image sensor pixel region 100. Black reference pixel region 200 includes black reference image sensor 24B formed therein, which is used for generating reference black level signals. Similarly, although one image sensor 24B is illustrated, there may be a plurality of image sensors 24B that form black level reference pixel array 42 (not shown in FIG. 1, please refer to FIG. 7). The entirety of black level reference pixel array 42 is located in black reference pixel region 200.

Figure 2:
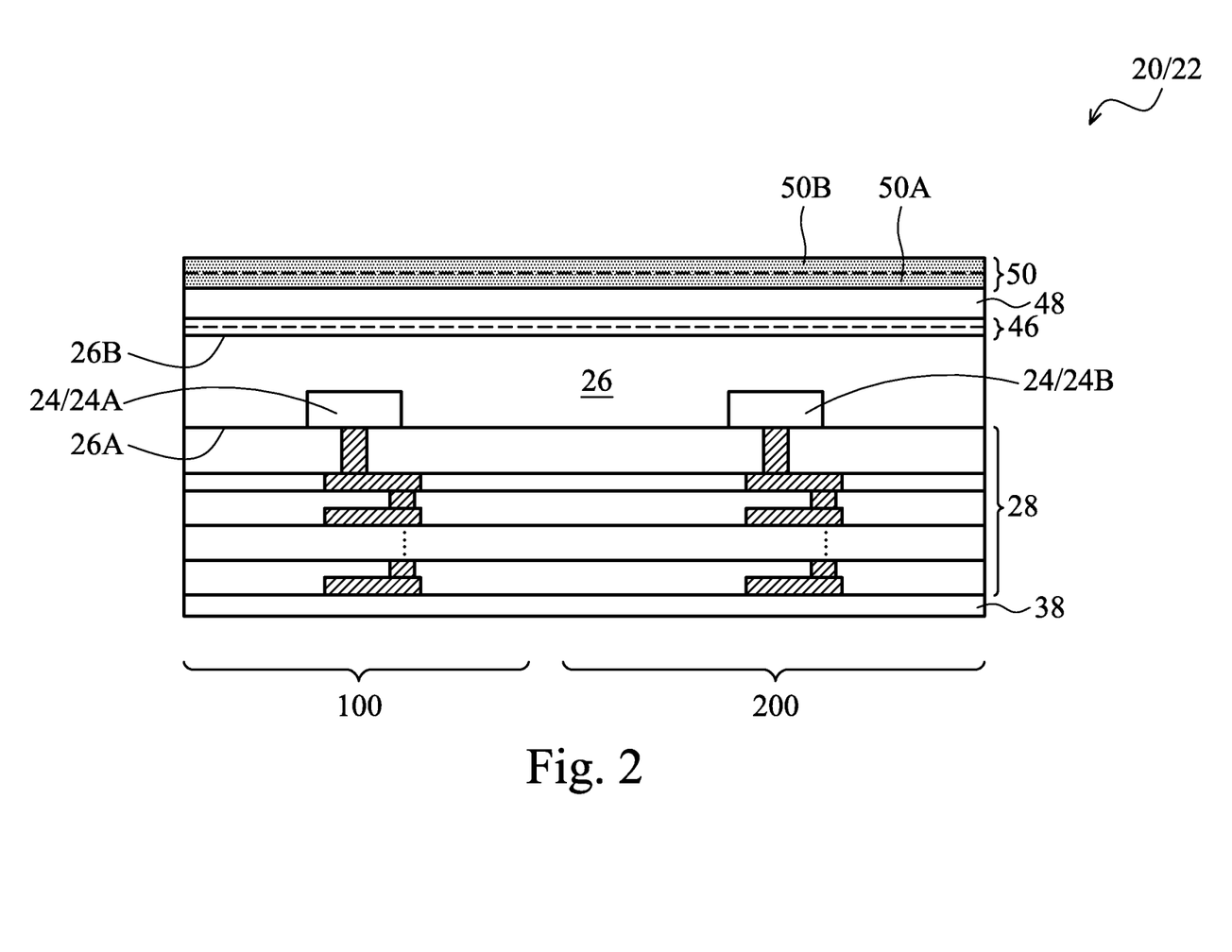

Next, refer to FIG. 2, wafer 22 is flipped over, and is attached to a carrier (not shown) that is under wafer 22. Accordingly, the top surfaces of each of the features as in FIG. 1 become bottom surfaces, and vice versa. After the flipping, semiconductor substrate 26 faces up. A backside grinding is then performed to thin semiconductor substrate 26, until the thickness of wafer 22 is smaller than about 30 μm, or smaller than about 5 μm, for example. Back surface 26B of the resulting semiconductor substrate 26 is marked. With semiconductor substrate 26 having a small thickness, light can penetrate from back surface 26B into semiconductor substrate 26 to reach image sensor 24A.

After the step of thinning, buffer layers 46 are formed on the surface of semiconductor substrate 26. In some exemplary embodiments, buffer layers 46 include a silicon oxide layer, a bottom anti-reflective coating (BARC) layer over the silicon oxide layer, and another oxide layer over the BARC layer. It is appreciated that buffer layers 46 may have different structures, and may have different number of layers other than illustrated.

In some embodiments, buffer layer 48 is formed over buffer layers 46. Buffer layer 48 may be formed of silicon oxide. Adhesion layer 50 is formed over buffer layer 48. Adhesion layer 50 is used for improving the adhesion between the subsequently formed metal shielding layer 52 (not shown in FIG. 2, please refer to FIG. 3) and the underlying layers such as buffer layer 48. Furthermore, adhesion layer 50 may be used as a barrier for preventing the inter-diffusion between the overlying and underlying layers. In some embodiments, adhesion layer 50 comprises nitrogen and a metal, which may be tantalum, titanium, or combinations thereof. In accordance with some exemplary embodiments, adhesion layer 50 includes a lower portion 50A, which is formed of tantalum, and upper portion 50B, which is formed of tantalum nitride. In alternative embodiments, an entirety of adhesion layer 50 comprises the compound of nitrogen and the metal, which compound may be tantalum nitride, for example.

The formation methods of adhesion layer 50 include Physical Vapor Deposition (PVD), wherein the desirable metals such as tantalum and/or titanium are included in the target of the respective PVD chamber. The process gas used in the formation of adhesion layer 50 may include nitrogen ($N_2$) and argon (Ar). During the formation of adhesion layer 50, the volume percentage and the flow-rate ratio of nitrogen among all process gases are high. For example, during the formation of adhesion layer 50, flow-rate ratio FN/(FN+FAr) is greater than about 35 percent, and may be between about 35 percent and about 80 percent, wherein FN is the flow rate of nitrogen, and FAr is the flow rate of argon. Furthermore, in the process chamber for depositing adhesion layer 50, the partial-pressure ratio PN/(PN+PAr) may be greater than about 35 percent, and may be between about 35 percent and about 80 percent, wherein PN is the partial pressure of nitrogen in the process chamber, and PAr is the partial pressure of argon in the process chamber. During the formation of adhesion layer 50, the temperature of wafer 22 may be between about −20° C. and about 150° C. The thickness of adhesion layer 50 may be between about 20 Å and about 2,000 Å, for example.

In some embodiments, the atomic percentage of nitrogen in adhesion layer 50 is greater than about 15 percent, or between about 15 percent and about 60 percent. Adhesion layer 50 is accordingly a nitrogen-rich layer in accordance with some embodiments. When the nitrogen flow rate and/or the partial pressure of nitrogen in the formation of adhesion layer 50 are increased, the grain sizes of adhesion layer 50 may become increasingly smaller. The grain sizes of the grains, if any, in adhesion layer 50 are smaller than about 50 Å in some exemplary embodiments. When the nitrogen flow-rate ratio or the partial-pressure ratio is greater than certain threshold value, for example, about 35 percent, the corresponding adhesion layer 50 is an amorphous-like layer, which is either substantially amorphous layer, or includes very small grains that have grain sizes smaller than about 50 Å. Accordingly, in some embodiments, adhesion layer 50 is substantially free from grains with sizes greater than about 50 Å. Alternatively, amorphous-like adhesion layer 50 may also include a very small amount larger grains, but overall still has an amorphous appearance.

Figure 3:
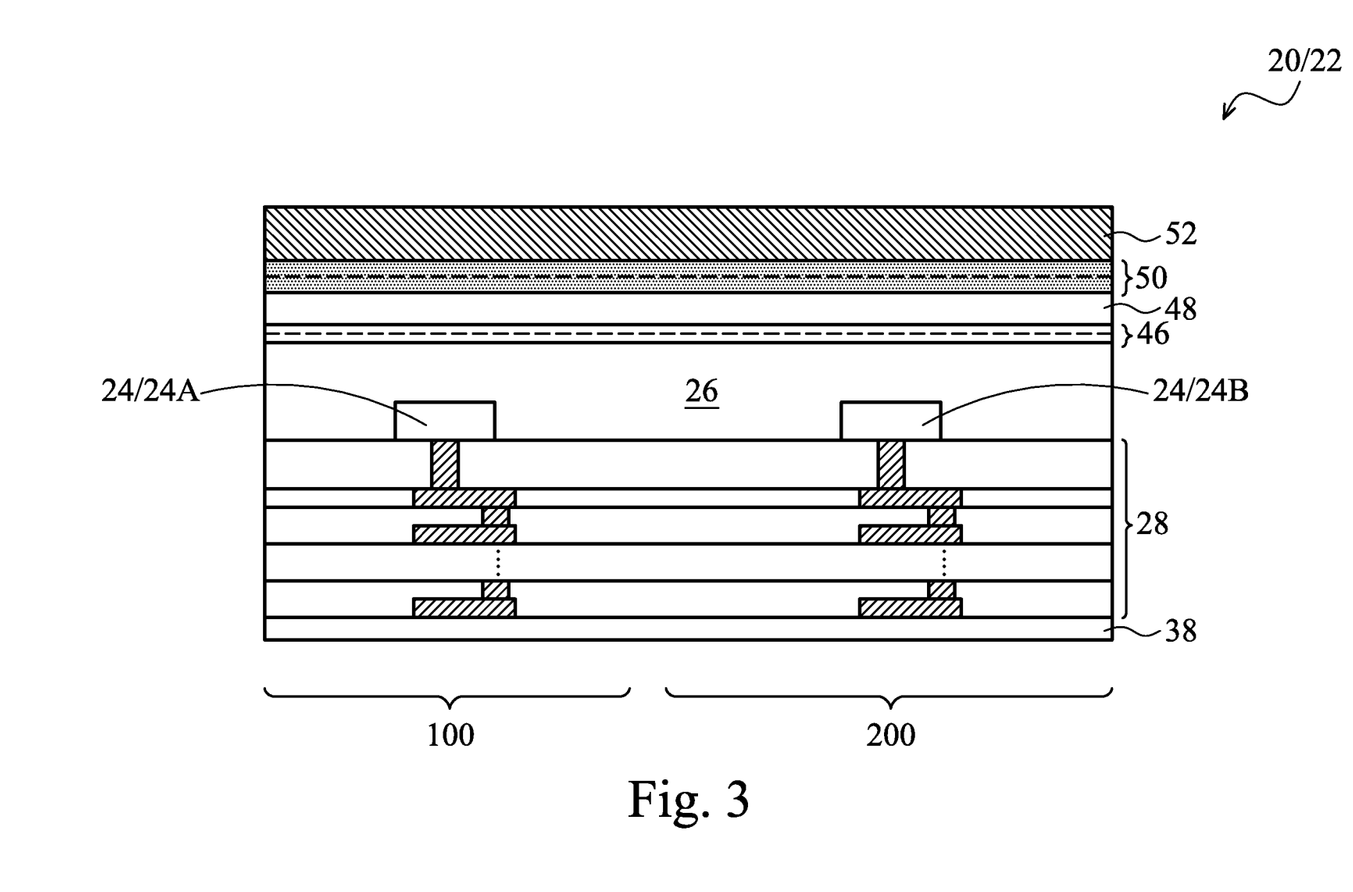

Referring to FIG. 3, metal shielding layer 52 is formed over, and contacting, adhesion layer 50. In some embodiments, metal shielding layer 52 includes aluminum copper, although other metals such as copper, aluminum, silver, nickel, or the like, may also be used. The thickness of metal shielding layer 52 may be between about 2 kÅ and about 6 kÅ, although the thickness may also be greater or smaller. Exemplary formation methods include PVD and other applicable methods such as some Chemical Vapor Deposition (CVD) methods.

Figure 4:
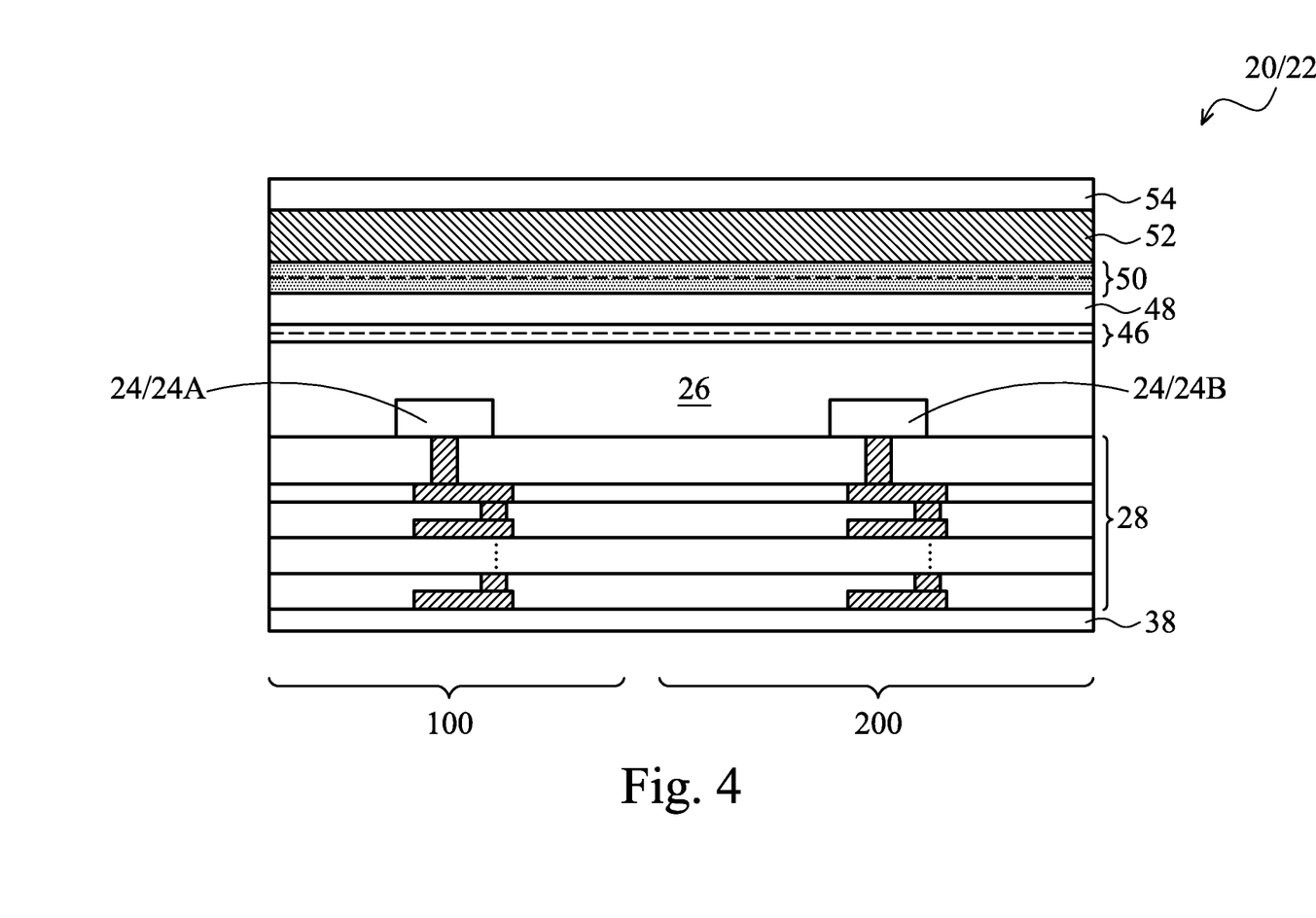

Referring to FIG. 4, buffer layer 54 is formed. Buffer layer 54 may include a single layer in some embodiments. Alternatively, buffer layer 54 is a composite layer including a plurality of dielectric layers. In some exemplary embodiments, buffer layer 54 comprises silicon oxide, which may be formed, for example, using Plasma Enhanced Chemical Vapor Deposition (PECVD).

Figure 5:
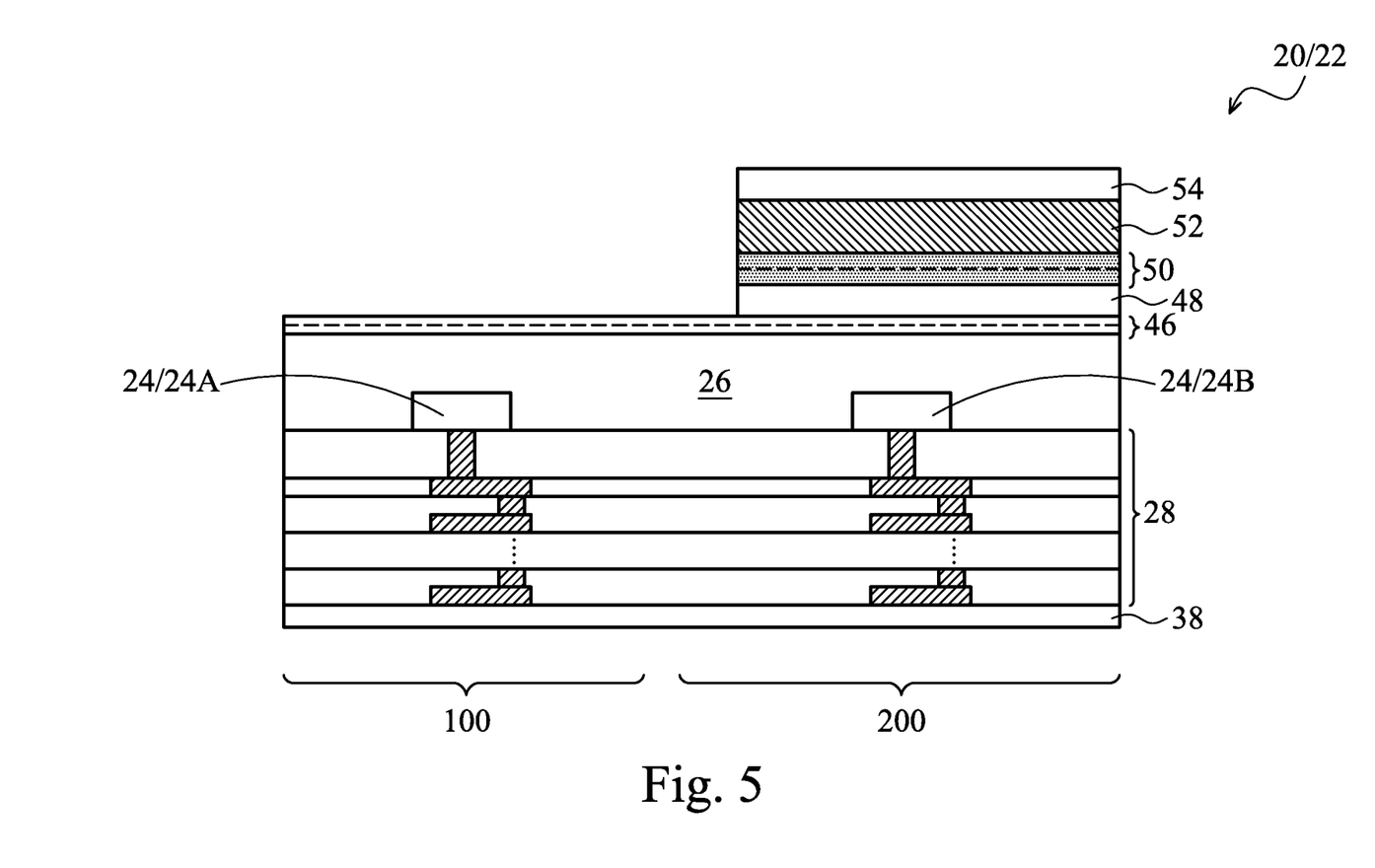

As shown in FIG. 5, buffer layer 54, metal shielding layer 52, and adhesion layer 50 are patterned. Buffer layer 48 may also be patterned. The patterning of layers 48, 50, and 52 may be performed using a same etching mask (not shown), so that the respective edges of layers 48, 50, and 52 are aligned. After the patterning, the portions of adhesion layer 50 and metal shielding layer 52 in active image sensor pixel region 100 are removed. In black reference pixel region 200, on the other hand, the portions of adhesion layer 50 and metal shielding layer 52 remain not removed. The portions of adhesion layer 50 and metal shielding layer 52 in black reference pixel region 200 are vertically aligned to image sensor 24B and the respective black level reference pixel array 42 (FIG. 7).

Figure 6:
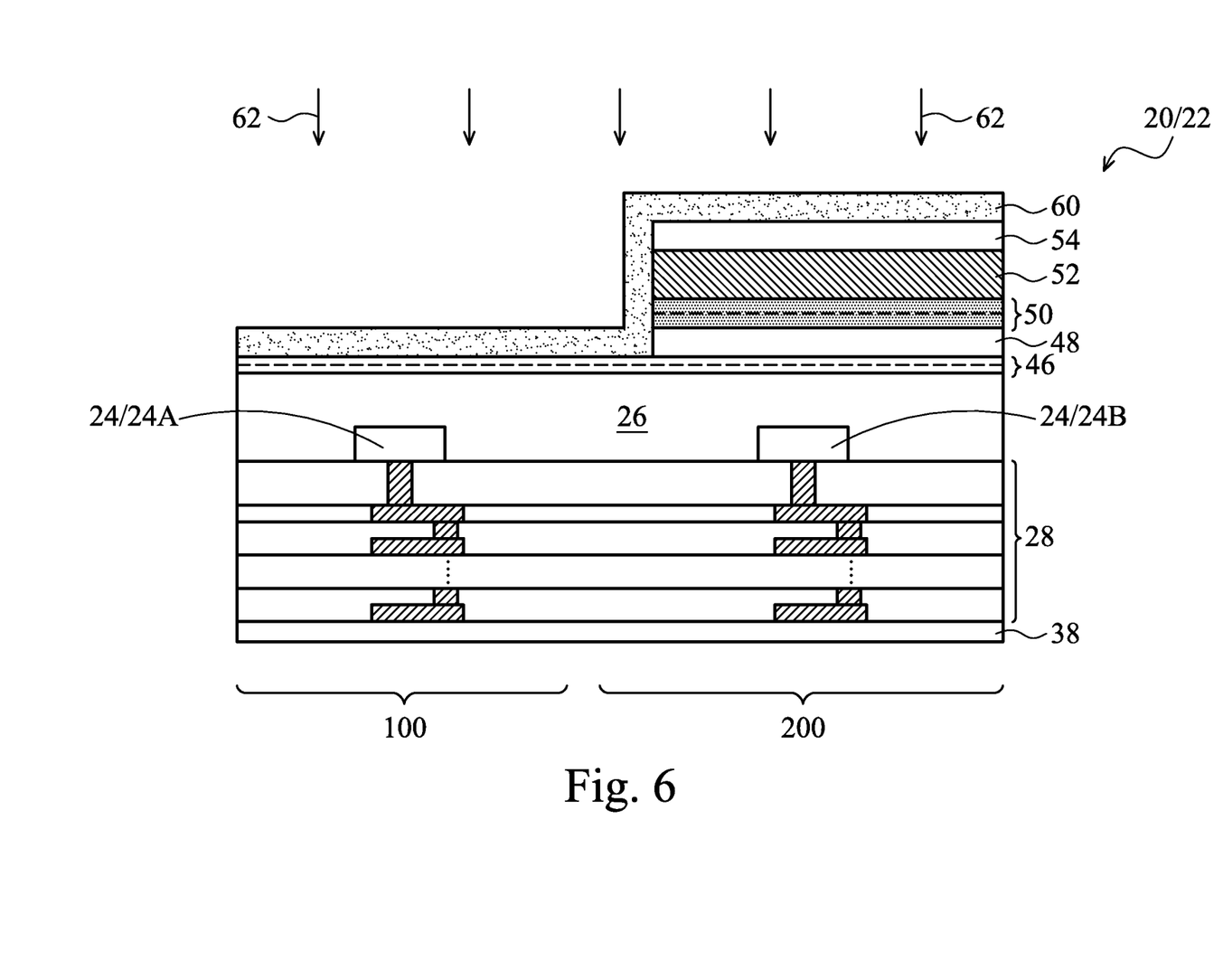

Referring to FIG. 6, passivation layer 60 is formed to cover the surfaces of the backside features of wafer 22. Passivation layer 60 may include a silicon oxide layer formed using PECVD. Alternatively, passivation layer 60 may include a plurality of layers, which are configured to reduce the reflection of incident light 62. Metal shielding layer 52 has the function of blocking and reflecting light 62. Active image sensor 24A is not covered by metal shielding layer 52, and hence is exposed to the incident light 62. Black reference image sensor 24B is covered by metal shielding layer 52, and is not exposed to incident light 62. Accordingly, active image sensor 24A may be calibrated using black reference image sensor 24B. In some embodiments, the calibration includes subtracting the electrical signal generated by black reference image sensor 24B from the electrical signal generated by active image sensor 24A.

Figure 7:
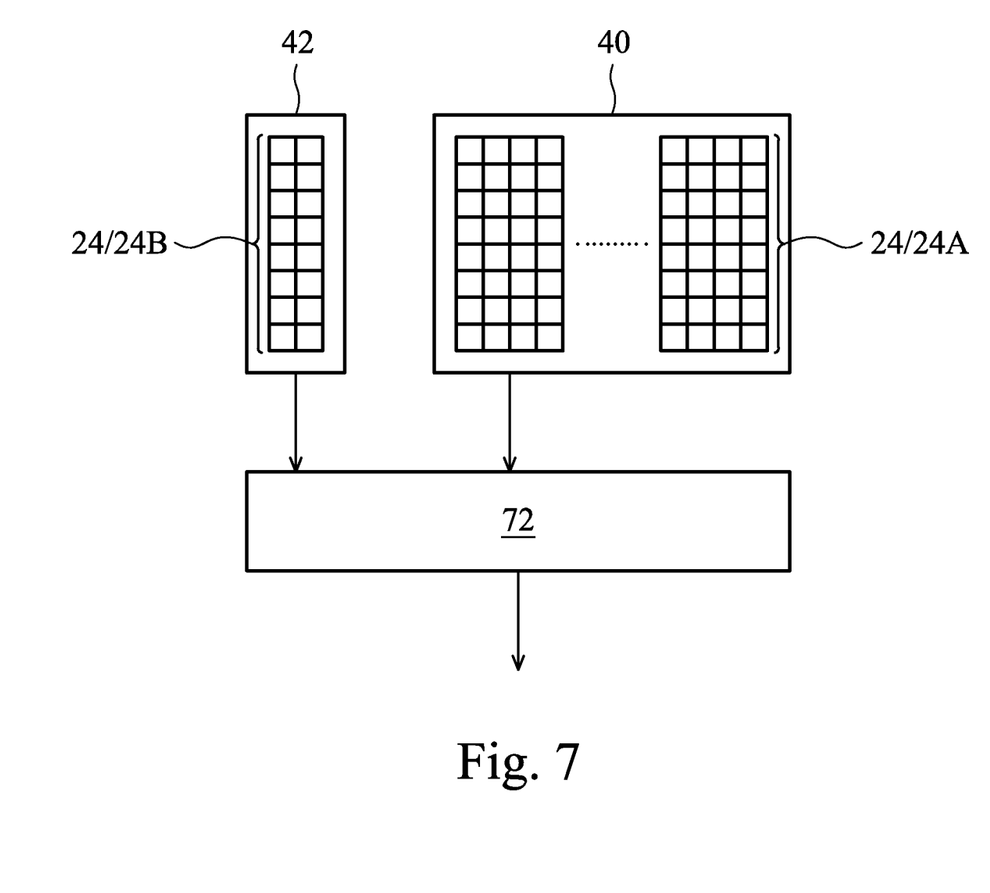
FIG. 7 is a schematic block diagram of a BSI image system.

FIG. 7 schematically illustrates an exemplary functional block diagram of BSI image system 70, which includes active image sensor pixel array 40, black level reference pixel array 42, and black level calibration circuit 72. Active image sensor pixel array 40 includes a plurality of active image sensors 24A. Black level reference pixel array 42 includes a plurality of black reference image sensors 24B. When BSI image system 70 is used to generate an image, active image sensors 24A are exposed to light. Each of active image sensors 24A generates an electrical signal in response to the respective light intensity (the number of photons). Black level calibration circuit 72 calibrates the electrical signals of active image sensors 24A using the electrical signals generated by black level reference pixel array 42, and outputs the calibrated electrical signals of active image sensors 24A. The unwanted portions of the electrical signals, which may include non-optically generated signals such as the leakage signals, thermally generated signals, dark currents, or the like, are thus cancelled from the electrical signals of active image sensors 24A.

In the embodiments, by forming amorphous adhesion layer 50 (FIG. 6), the overlying metal shielding layer 52 accordingly has a smooth top surface. This in turn results in the improvement in the performance of the function of black reference image sensor 24B. Experiment results indicated that when conventional processes are used, and the flow-rate ratio FN/(FN+FAr) is about 26 percent, the corresponding TaN adhesion layer 50 is a poly-grain layer. The corresponding gray level uniformity, which measured as the (wafer-edge-grey-level−wafer-center-grey-level)/wafer-center-grey-level, is usually greater than 7 percent, and the variation of the gray level uniformity is high. Since the "7 percent" gray level uniformity is a dividing point distinguishes whether samples may fail or not, the resulting sample devices have a high possibility to fail. As a comparison, when the embodiments are employed, and the flow-rate ratio FN/(FN+FAr) is increased to about 50 percent, the corresponding TaN adhesion layer 50 is an amorphous layer. The corresponding gray level uniformity is improved to substantially reliably smaller than 7 percent. Accordingly, the failure rate of the sample devices is very low. This indicates that the structure of adhesion layer 50 significantly affects the quality of chip 20, and amorphous adhesion layer 50 is beneficial for the gray level uniformity.

In accordance with embodiments, a device includes a semiconductor substrate having a front side and a backside. A photo-sensitive device is disposed at a surface of the semiconductor substrate, wherein the photo-sensitive device is configured to receive a light signal from the backside of the semiconductor substrate, and convert the light signal to an electrical signal. An amorphous-like adhesion layer is disposed on the backside of the semiconductor substrate. The amorphous-like adhesion layer includes a compound of nitrogen and a metal. A metal shielding layer is disposed on the backside of the semiconductor substrate and contacting the amorphous-like adhesion layer.

In accordance with other embodiments, a semiconductor substrate includes a front surface and a back surface, wherein the back surface is over the front surface. A first photo-sensitive device and a second photo-sensitive device are at the front surface of the semiconductor substrate. A dielectric layer is over the back surface of the semiconductor substrate. An amorphous-like adhesion layer is over the dielectric layer, wherein the amorphous-like adhesion layer includes a compound of nitrogen and a metal. A metal shielding layer is over and contacting the amorphous-like adhesion layer. The metal shielding layer is over and aligned to the first photo-sensitive device, and does not extend to over the second photo-sensitive device.

In accordance with yet other embodiments, a method includes forming a first photo-sensitive device and a second photo-sensitive device at a front surface of a semiconductor substrate, and forming a dielectric layer over a back surface of the semiconductor substrate. The dielectric layer is on a backside of the semiconductor substrate. An amorphous-like adhesion layer is deposited over the dielectric layer, wherein the amorphous-like adhesion layer includes a compound of nitrogen and a metal. A metal shielding layer is formed over and contacting the amorphous-like adhesion layer. The amorphous-like adhesion layer and the metal shielding layer are on the backside of the semiconductor substrate. The amorphous-like adhesion layer and the metal shielding layer are patterned to remove a first portion of the amorphous-like adhesion layer and a first portion of the metal shielding layer. A second portion of the amorphous-like adhesion layer and a second portion of the metal shielding layer remain over the dielectric layer after the step of patterning.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate having a front side and a backside;
    a first photo-sensitive device at a surface of the semiconductor substrate, wherein the first photo-sensitive device is configured to receive a light signal from the backside of the semiconductor substrate and convert the light signal to an electrical signal;
    an adhesion layer on the backside of the semiconductor substrate, the adhesion layer comprising an amorphous region and grains, substantially all grains in the adhesion layer having sizes smaller than about 50 Å, wherein the adhesion layer comprises a compound of nitrogen and a metal; and
    a metal shielding layer on the backside of the semiconductor substrate and contacting the adhesion layer.

2. The device of claim 1 further comprising a second photo-sensitive device, wherein the metal shielding layer and the adhesion layer are over and aligned to the first photo-sensitive device, and wherein the metal shielding layer and the adhesion layer do not extend to over the second photo-sensitive device.

3. The device of claim 1, wherein the adhesion layer comprises a material selected from the group consisting essentially of tantalum nitride, titanium nitride, and combinations thereof.

4. The device of claim 1, wherein the metal shielding layer comprises aluminum copper.

5. The device of claim 1, wherein the first photo-sensitive device is disposed at a front surface of the semiconductor substrate.

6. The device of claim 1 further comprising a low-k dielectric layer on the front side of the semiconductor substrate.

7. The device of claim 1, wherein an atomic percentage of nitrogen in the adhesion layer is between about 15 percent and about 60 percent.

8. A device comprising:
    a semiconductor substrate comprising a front surface and a back surface, wherein the back surface is over the front surface;

a first photo-sensitive device and a second photo-sensitive device at the front surface of the semiconductor substrate;
a dielectric layer over the back surface of the semiconductor substrate;
a first anti-reflective coating layer over the dielectric layer;
an adhesion layer over the first anti-reflective coating layer, wherein the adhesion layer comprises a compound of nitrogen and a metal;
a metal shielding layer over and contacting the adhesion layer, wherein the metal shielding layer is over and aligned to the first photo-sensitive device, and wherein the metal shielding layer does not extend to over the second photo-sensitive device; and
a passivation layer comprising a first portion over and aligned to the metal shielding layer, a second portion on a sidewall of the metal shielding layer, and a third portion over and aligned to the second photo-sensitive device, wherein the passivation layer is configured to act as a second anti-reflective coating layer, and wherein the device has a gray level uniformity of less than 7%, the gray level uniformity being measured by a ratio of a difference between a gray level at an edge of the semiconductor substrate and a gray level at a center of the semiconductor substrate to the gray level at the center of the semiconductor substrate.

9. The device of claim 8, wherein the adhesion layer comprises tantalum nitride.

10. The device of claim 8, wherein the second photo-sensitive device is configured to receive photons penetrating through the semiconductor substrate from the back surface of the semiconductor substrate, and wherein the first photo-sensitive device is blocked from receiving photons by the metal shielding layer.

11. The device of claim 8, wherein the adhesion layer is substantially free from grains that have sizes greater than about 50 Å.

12. The device of claim 8, wherein the adhesion layer is an amorphous layer.

13. The device of claim 8 further comprising a first array of photo-sensitive devices and a second array of photo-sensitive devices, wherein the metal shielding layer and the adhesion layer are over and aligned to the first array of photo-sensitive devices, and wherein the second array of photo-sensitive devices is configured to receive photons penetrating through the semiconductor substrate from the back surface.

14. The device of claim 8, wherein an atomic percentage of nitrogen in the adhesion layer is between about 15 percent and about 60 percent.

15. A device comprising:
a semiconductor substrate comprising a front surface and a back surface, wherein the back surface is over the front surface;
a first photo-sensitive device and a second photo-sensitive device in the semiconductor substrate;
a first dielectric layer over the back surface of the semiconductor substrate;
a first anti-reflective coating layer over the first dielectric layer;
an adhesion layer over the first anti-reflective coating layer, wherein the adhesion layer comprises tantalum nitride, with an atomic percentage of nitrogen in the adhesion layer being higher than about 15 percent;
a metal shielding layer over the adhesion layer, wherein the metal shielding layer is over and aligned to the first photo-sensitive device;
a second dielectric layer comprising a first portion over and aligned to the metal shielding layer, a second portion on a sidewall of the metal shielding layer, and a third portion over and aligned to the second photo-sensitive device, wherein the second dielectric layer is configured to act as a second anti-reflective coating layer; and
a black level calibration circuit, the device having a gray level uniformity of less than 7%.

16. The device of claim 15, wherein substantially all grains in the adhesion layer have sizes smaller than about 50 Å.

17. The device of claim 15, wherein the adhesion layer has an amorphous structure.

18. The device of claim 15, wherein the metal shielding layer, the adhesion layer, and the first dielectric layer do not extend to over the second photo-sensitive device, and edges of the metal shielding layer, the adhesion layer, and the first dielectric layer are aligned with each other.

19. The device of claim 15, wherein the metal shielding layer has a surface in physical contact with a surface of the adhesion layer.

20. The device of claim 15, wherein the metal shielding layer comprises aluminum copper.

* * * * *